United States Patent
Majima

[19]

[11] Patent Number: 6,104,516
[45] Date of Patent: Aug. 15, 2000

[54] WAVELENGTH-CHANGEABLE LIGHT SOURCE CAPABLE OF CHANGING WAVELENGTH OF OUTPUT LIGHT, OPTICAL COMMUNICATION NETWORK USING THE SAME AND WAVELENGTH CONTROL METHOD FOR CONTROLLING WAVELENGTH

[75] Inventor: Masao Majima, Isehara, Japan

[73] Assignee: Canon Kabushiki Kaisha, Tokyo, Japan

[21] Appl. No.: 08/872,390

[22] Filed: Jun. 10, 1997

[30] Foreign Application Priority Data

Jun. 11, 1996 [JP] Japan ................................. 8-149143

[51] Int. Cl.$^7$ .................................................. H04B 10/04
[52] U.S. Cl. .............................. 359/181; 372/20; 372/32; 372/34
[58] Field of Search .............................. 359/181; 372/32, 372/34, 20

[56] References Cited

U.S. PATENT DOCUMENTS

| | | | |
|---|---|---|---|
| 4,792,956 | 12/1988 | Kamin | 372/29 |
| 4,897,843 | 1/1990 | Scott | 372/20 |
| 5,048,032 | 9/1991 | Ekstrand et al. | 372/34 |
| 5,438,579 | 8/1995 | Eda et al. | 372/32 |
| 5,552,919 | 9/1996 | Majima et al. | 359/161 |
| 5,594,577 | 1/1997 | Majima et al. | 359/124 |
| 5,642,371 | 6/1997 | Tohyama et al. | 372/45 |
| 5,654,814 | 8/1997 | Ouchi et al. | 359/156 |
| 5,684,590 | 11/1997 | Sanders et al. | 372/32 |
| 5,754,574 | 5/1998 | Lofthouse-Zeis et al. | 372/34 |
| 5,889,801 | 3/1999 | Kato et al. | 372/20 |

FOREIGN PATENT DOCUMENTS

| | | |
|---|---|---|
| 0 529 731 | 3/1993 | European Pat. Off. . |
| 7-86694 | 3/1995 | Japan . |
| WO96/10855 | 4/1998 | WIPO . |

OTHER PUBLICATIONS

T. Mizuotchi, et al., "622 M bit/s–16ch FDM Coherent Light Transmission Apparatus", Electronic Information Communication Society, Technical Report OCS 92–88, (Mar. 1993) pp. 25–30.

Y. Yoshikuni, et al., "Broad Wavelength Tuning Under Single–Mode Oscillation with a Multi–Electrode Distributed Feedback Laser," IEE Electronics Letters, vol. 22, No. 22, pp 1153–54 (Oct. 1986).

T. Kameda, et al., "Heaters On Passive Region Employed (HOPE) DBR–LD," Japanese Academy of Electronics Information Communications, Autumnal Meeting, Lecture No. C–149, pp. 4–171 (1992).

*Primary Examiner*—Jeffery A. Hofsass
*Assistant Examiner*—John Tweel, Jr.
*Attorney, Agent, or Firm*—Fitzpatrick, Cella, Harper & Scinto

[57] ABSTRACT

In a wavelength-changeable light source of the present invention, a wavelength control is performed using a plurality of control systems when the wavelength of a laser, particularly a semiconductor laser, is to be controlled. Wavelength control characteristics of the respective control systems are different from each other, and the wavelength control can be flexibly carried out by combining those characteristics. Specifically, one of the plural control systems is a current control unit for controlling a current supplied to the semiconductor laser and another thereof is a temperature control unit for controlling temperature of the semiconductor laser. In the structure, the wavelength shift with a speedy response time, which can be attained in a wavelenth-changeable range obtainable by the current control, can be carried out over a wide wavelength-changeable range obtainable by the temperature control.

36 Claims, 9 Drawing Sheets

STEADY STATE
  CURRENT CONTROL: INCREASE AND DECREASE ARE REPEATED
  TEMPERATURE CONTROL: UNCHANGED

FIG. 5A

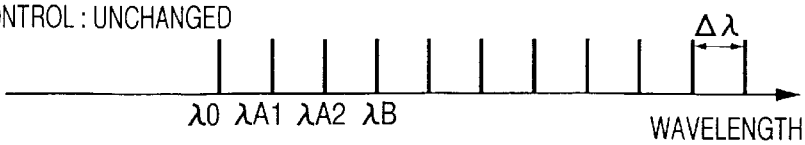

OSCILLATION OF ADJACENT WAVELENGTH λA1 IS STOPPED
  CURRENT CONTROL: CURRENT INCREASES AND WAVELENGTH SHIFTS
                  TO A LONGER SIDE
  TEMPERATURE CONTROL: UNCHANGED

FIG. 5B

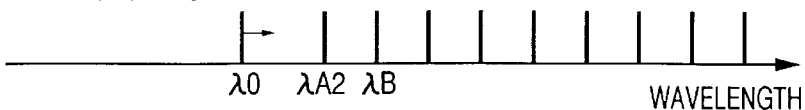

QUASI-STEADY STATE
  CURRENT CONTROL: CURRENT VALUE GRADUALLY RETURNS TO ORIGINAL VALUE
  TEMPERATURE CONTROL: TEMPERATURE GRADUALLY INCREASES TO CANCEL
  WAVELENGTH SHIFT TO A SHORTER SIDE BY CURRENT CONTROL

FIG. 5C

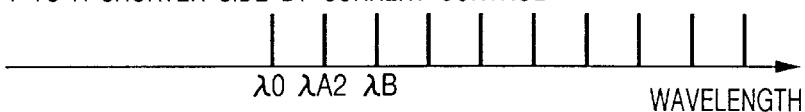

STEADY STATE
  CURRENT CONTROL: INCREASE AND DECREASE ARE REPEATED
  TEMPERATURE CONTROL: UNCHANGED

FIG. 5D

OSCILLATION OF λB IS STOPPED AND WAVELENGTHS ON A SHORTER
WAVELENGTH SIDE THAN λB SHIFT TO A LONGER SIDE
  CURRENT CONTROL: CURRENT INCREASES AND WAVELENGTH SHIFTS TO A LONGER SIDE
  TEMPERATURE CONTROL: UNCHANGED

FIG. 5E

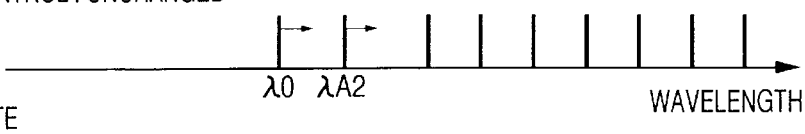

QUASI-STEADY STATE
  CURRENT CONTROL: CURRENT VALUE GRADUALLY RETURNS TO ORIGINAL VALUE
  TEMPERATURE CONTROL: TEMPERATURE GRADUALLY INCREASES TO CANCEL
  WAVELENGTH SHIFT TO A SHORTER SIDE BY CURRENT CONTROL

FIG. 5F

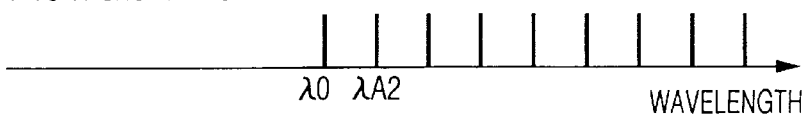

STEADY STATE
  CURRENT CONTROL: INCREASE AND DECREASE ARE REPEATED
  TEMPERATURE CONTROL: UNCHANGED

FIG. 5G

WAVELENGTH-CHANGEABLE LIGHT SOURCE CAPABLE OF CHANGING WAVELENGTH OF OUTPUT LIGHT, OPTICAL COMMUNICATION NETWORK USING THE SAME AND WAVELENGTH CONTROL METHOD FOR CONTROLLING WAVELENGTH

BACKGROUND OF THE INVENTION

1. Field of the Invention

The present invention relates to a wavelenth-changeable or tunable light source using a laser, and particularly to a wavelength-changeable or tunable light source using a semiconductor laser (hereinafter also referred to as LD), an optical communication network using the light source and a wavelength control method for controlling the wavelength of output light from the light source.

2. Related Background Art

Study and development of a wavelength-changeable light source have been increasingly advanced as an important key device in the fields of wavelength division multiplexing communications, optical measurements and so forth. For example, study and development of a single-wavelength operative LD, such as a distributed feedback laser diode (DFB-LD) and a distributed Bragg reflector laser diode (DBR-LD), have been promoted. An example thereof will hereinafter be described.

FIG. 7 is a block diagram illustrating a wavelength-changeable light source using a two-electrode DFB-LD. The light source includes a two-electrode DFB-LD module 701, a two-output current source 702, a temperature controller 203 and a wavelength control system #4 (703).

The two-electrode DFB-LD module 701 is a device in which its current-injection electrode is divided into two portions and the wavelength of its light output can be changed by controlling a current injected into the device. An example thereof is disclosed in "Journal of Electronics Letters, volume 22, No. 22, pp. 1153–1154". In this example, the lasing wavelength is in a range of 1556 nm to 1558 nm and thus a wavelength-changeable range of about 2 nm is attained. Further, some manufacturers presently sell such a device as a module for the use of study. The two-electrode DFB-LD module 701 is constructed by packaging the above two-electrode DFB-LD together with an optical coupling system, an optical isolator, an optical fiber, a Peltier element, a thermistor and so forth. Since the lasing wavelength of the two-electrode DFB-LD shifts due to a change in its ambient or environmental temperature, the device temperature of the two-electrode DFB-LD is controlled by the Peltier element and the thermistor and thus a change in the lasing wavelength due to the temperature change is controlled. The optical isolator prevents the return of light into the two-electrode DFB-LD, and hence stabilizes the lasing wavelength of the two-electrode DFB-LD.

Further, the two-output current source 702 is an electric current source which has two independent outputs. The output currents of the current source 702 are set by a current control signal input from its outside (i.e., from the wavelength control system #4). The temperature controller 203 causes a current to flow into the thermistor (which is arranged in the two-electrode DFB-LD module) and measures the temperature by detecting a voltage between the thermistor terminals. The temperature controller 203 further drives the Peltier element (which is also arranged in the two-electrode DFB-LD module) having heat-generation and heat-absorption characteristics due to a current injected thereinto such that the measured temperature reaches a target temperature. The Peltier element can increase or decrease the temperature of a heat sink on which the two-electrode DFB-LD is mounted. The target temperature can be set in the temperature controller or by using a temperature control signal from its outside. Further, a difference between the target temperature and the measured temperature is output as a temperature control monitor signal. In this example, the target temperature is internally set. The wavelength control system #4 (703) controls the two-output electric current source 702 by using the current control signal, and controls the wavelength of the two-electrode DFB-LD module 701.

FIG. 8 illustrates another example of the wavelength-changeable light source using a DFB-LD. The light source is comprised of a single-electrode DFB-LD module 201, a current source 202, a temperature controller 203 and a wavelength control system #5 (801).

The single-electrode DFB-LD module 201 is a device that is presently sold commercially as a module by several manufacturers. Since the device only has a single electrode, its lasing wavelength can not be largely varied by a current injected thereinto. The ratio of a change in the lasing wavelength relative to the injected current is small, such as about 0.008 nm/mA, and the light output is also varied as the injected current increases. Therefore, the wavelenth-changeable range due to the current is in the order of 0.1 nm. For this reason, the wavelength is changed by using a change in the temperature in this example. For instance, the ratio of a change in the wavelength relative to the temperature is about 0.08 nm/° C. and thus the wavelength-changeable range in the order of nanometer can be obtained.

The DFB-LD module 201 is constructed by packaging the above DFB-LD together with the optical coupling system, the optical isolator, the optical fiber, the Peltier element, the thermistor and so forth. For example, in a DFB laser diode manufactured by Fujitsu Limited, FLD150F2KP (a trade name), a threshold current is 20 mA, a forward voltage 1.1 V (IF=30 mA), a standard value of its peak lasing wavelength is 1550 nm and a maximum of its spectral half width is 0.2 nm. This is a light emitting device with a single mode fiber. The inventor of the present invention measured characteristics of that light emitting element, and obtained the characteristics shown in FIGS. 9A and 9B. FIG. 9A shows the characteristic of the lasing wavelength relative to the temperature, and FIG. 9B shows the characteristic of the lasing wavelength relative to a supplied current. It can be known from those measurement results that the wavelength can be varied in a range having a width of 2 nm by the temperature control between 15° C. and 35° C. and that the wavelength can be varied in a range having a width of 0.35 nm by the current control between 30 mA and 70 mA.

The current source 202 is a single-output current source. Its output current can be controlled by the internal setting or by the current control signal input thereinto from outside. In this example, the internal setting is performed. The temperature controller 203 is the same as illustrated in FIG. 7. In this example, the voltage between the thermistor terminals from the DFB-LD module 201 is detected by the temperature controller 203, and the temperature control monitor signal is recognized by the wavelength control system #5. In addition thereto, the wavelength control system #5 outputs the temperature control signal, by which the DFB-LD module 201 is set to a desired wavelength, on the basis of that temperature control monitor signal. Accordingly, the temperature setting is performed by controlling the temperature controller 203 using the temperature control signal from outside (i.e., from the wavelength control system #5). The wavelength control system #5 (801) thus controls the temperature controller 203 by using the temperature control signal, and controls the lasing wavelength of the DFB-LD module 201. On the other hand, the wavelength control system #5 (801) monitors the condition of the temperature control by using the temperature control monitor signal from the DFB-LD module 201.

The above-discussed wavelength-changeable light sources, however, have the following disadvantages.

The drawback of the example using the two-electrode DFB-LD will be initially described. This device has been only produced on trial, and its fabrication process for mass production has not yet been established and hence its cost is high. Situations of other multi-electrode wavelenth-changeable LDs, such as three-electrode DFB-LDs and three-electrode DBR-LDs, are the same. Therefore, though those device have the wavelength-changeable range having a width of 2 nm, the supply of those devices having sufficiently stable characteristics is not yet achieved.

The drawback of the example using the temperature control will next be described. Generally, the response of a temperature control system is slow. The same is also true in the temperature control system of the LD module in which the temperature is detected by the thermistor and the temperature is controlled by the Peltier element. Specifically, it is difficult to settle its control within one second. Further, as the settling time of the control is shortened, overshooting is likely to occur. When such a device is used as a light source in wavelength division multiplexing communications with narrow intervals between channels, crosstalk is likely to occur during the time of changing the wavelength.

It is an object of the present invention to provide a wavelength-changeable or tunable light source in which a current control with a speedy response and a narrow wavelength-changeable range is combined with a temperature control with a slow response and a wide wavelength-changeable range, hence the wavelenth-changeable range having a width in the order of a nanometer is achieved even when a single-electrode DFB-LD is used and time required for the wavelength changing operation is shortened.

SUMMARY OF THE INVENTION

The inventor of the present invention as described in the specification of this application conceived that it is possible to use the temperature control in, for example, a laser, which controls its lasing wavelength by the current control, not only for suppression of influences of a change in the ambient or environmental temperature due to heat generation in the laser and a change in the exterior temperature but also for a control of changing the lasing wavelength and that hence the wavelength control can be flexibly performed. According to one aspect of the present invention invented based on that conception, there is provided the following wavelength-changeable light source:

This wavelength-changeable light source includes a laser, a first control unit for continuously controlling a lasing wavelength of the laser with a short response time and a second control unit for continuously controlling the lasing wavelength of the laser with a response time which is longer than the response time of the wavelength control by the first control unit. The second control unit controls the lasing wavelength so as to change the lasing wavelength.

The response time in the present invention does not mean a time period during which an actual control is performed, but means a time period required for a control at the time when this control is executed by the control unit. Further, throughout the specification, a continuous control of the lasing wavelength or a continuous control by the control unit means not only a control in which the control value is exactly continuously changed, but also a control in which a series of changes in the control value are continued at minute steps (this minute step is a step with such a minute magnitude that even when the wavelength of light is changed at this minute step, a receiver side receiving the light can unceasingly continue reception of the light without any change or with a tracking operation being conducted).

In such a light source, the control can be performed using the first control unit where the lasing wavelength needs to be changed speedily, and the control can be performed using the second control unit where the lasing wavelength may be changed slowly. Particularly, in a case where a wavelength-changeable range by the control of the second control unit is wider than a wavelength-changeable range by the control of the first control unit, a light source with a wide wavelength-changeable range and a short response time for the wavelength change can be obtained.

The present invention can take a construction in which the second control unit performs such a control that the amount of a change in the lasing wavelength by the first control unit is replaced by the amount of a change in the lasing wavelength by the second control unit. Specifically, after the lasing wavelength is speedily changed, for example, to a longer wavelength side by the first control unit, the control of changing the lasing wavelength to a longer wavelength side is executed by the second control unit while the control of changing the wavelength to a longer wavelength side by the first control unit is relaxed. The control of changing the wavelength to a shorter wavelength side is effected similarly. With regard to the control in which the amount of a change in the wavelength effected by the first control unit is replaced by the amount of a change in the wavelength effected by the second control unit, it is not limited to a control in which the amount of a change in the wavelength by the first control unit is 100% replaced by the amount of a change in the wavelength by the second control unit. The amount of a change in the wavelength by the second control unit may be larger or smaller than the amount of a change in the wavelength by the first control unit, depending on the situation. The former situation (a larger case) is, for example, a case where after the wavelength is promptly changed, the wavelength is further changed slowly to the same side. The latter situation (a smaller case) is, for example, a case where after the wavelength is promptly and sufficiently changed, an overshooting change in the lasing wavelength is returned to a target wavelength. In the case where the 100% replacement is carried out and a rate of returning the wavelength control by the first control unit to its original state is the same as a rate of replacing the wavelength control by the first control unit with the wavelength control by the second control unit, the wavelength remains substantially unchanged throughout the replacement process though the control for changing the wavelength is performed by the second control unit. The present invention also includes those constructions discussed above.

Since after the lasing wavelength is changed by the first control unit, the amount of change in the wavelength is replaced with the wavelength change conducted by the second control unit, a prompt response will be able to be completed when there occurs a need to speedily change the lasing wavelength again.

The following more specific structures may also be adopted. The laser can be a semiconductor laser. The first control unit can be a current control unit for controlling a current supplied to the semiconductor laser. The second control unit can be a temperature control unit for controlling temperature of the semiconductor laser.

Various constructions can be employed as a structure for controlling the two control units, and such a structure can be constructed by using an analog operational or arithmetic circuit.

Further, a wavelength-placement detecting unit for detecting the placement condition of wavelengths on a transmission line, to which output light of the laser is output, can be provided, and the first control unit and the second control unit can perform their own controls on the basis of wavelength-placement information obtained from the wavelength-placement detecting unit, respectively.

BRIEF DESCRIPTION OF THE DRAWINGS

FIGS. 5A, 5B, 5C, 5D, 5E, 5F and 5G are respectively representations for explaining the operation of a wavelength control conducted in the third embodiment.

DETAILED DESCRIPTION OF THE PREFERRED EMBODIMENTS

[First Embodiment]

A first embodiment of the present invention will be described with reference to FIGS. 1 and 2.

Figure 1:
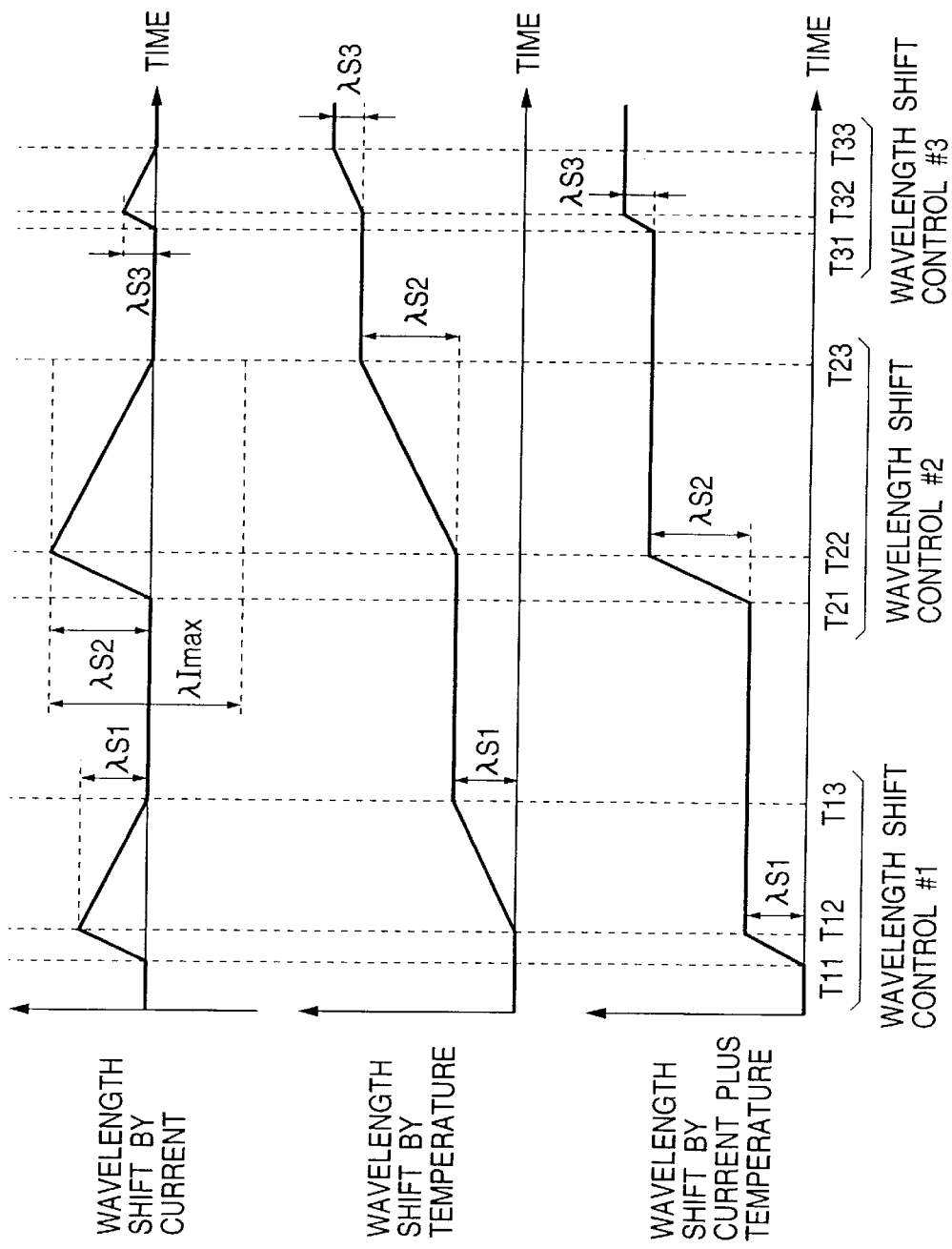
FIG. 1 is a timing chart for controlling the lasing wavelength of a wavelength-changeable light source.

FIG. 1 is a timing chart of the wavelength control performed by a wavelength-changeable light source of the present invention. In FIG. 1, the abscissa indicates time and the ordinate indicates the amount of a shift in the lasing wavelength. An uppermost part of FIG. 1 shows the wavelength shift by a current, its middle part shows the wavelength shift by temperature and its lowermost part shows the wavelength shift by the current plus temperature (i.e., a sum of the wavelength shift by the current and the wavelength shift by the temperature). The wavelength control for the wavelength shift will be referred to as a wavelength shift control hereinafter. In an example of FIG. 1, three wavelength shift controls indicated by #1, #2 and #3 are carried out. T11 indicates time at which the wavelength shift control #1 is started, T12 indicates time at which the wavelength shift by the wavelength shift control #1 is finished and T13 indicates time at which the control of the wavelength shift control #1 is finished. Likewise, T21, T22 and T23 respectively indicate times relevant to the wavelength shift control #2, and T31, T32 and T33 respectively indicate times relevant to the wavelength shift control #3. $\lambda S1$ indicates the amount of a wavelength shift attained in the wavelength shift control #1. Similarly, $\lambda S2$ and $\lambda S3$ respectively indicate the amounts of wavelength shifts attained in the wavelength shift controls #2 and #3. $\lambda Imax$ indicates a maximum value of a range of the wavelength shift which can be obtained by the control of a current.

Figure 2:
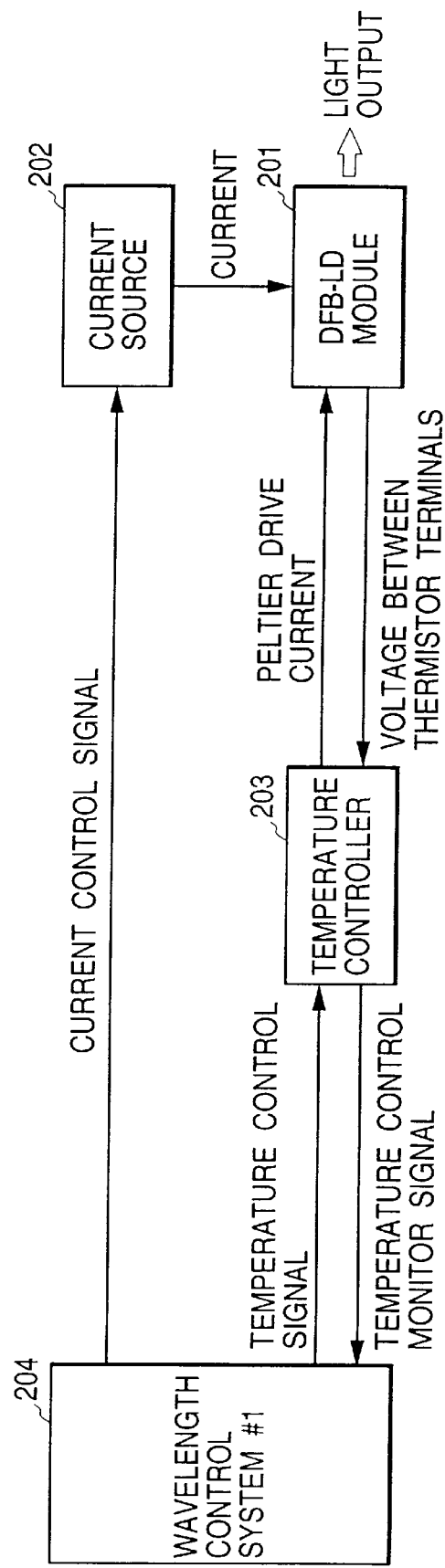
FIG. 2 is a view illustrating the structure of a first embodiment of a wavelength-changeable light source according to the present invention.

FIG. 2 illustrates the structure of the first embodiment of a wavelength-changeable light source of the present invention. This light source is comprised of a single-electrode DFB-LD module 201, a current source 202, a temperature controller 203 and a wavelength control system #1 (204).

In the DFB-LD module 201, the above-discussed single-electrode DFB-LD is packaged together with an optical coupling system, an optical isolator, an optical fiber, a Peltier element, thermistor and so forth. Since the lasing wavelength of the single-electrode DFB-LD shifts due to a change in the ambient temperature, the device temperature of the single-electrode DFB-LD is controlled by the Peltier element and the thermistor. The optical isolator intercepts the return of light to the single-electrode DFB-LD and thus stabilizes the lasing wavelength of the single-electrode DFB-LD.

Figure 8:
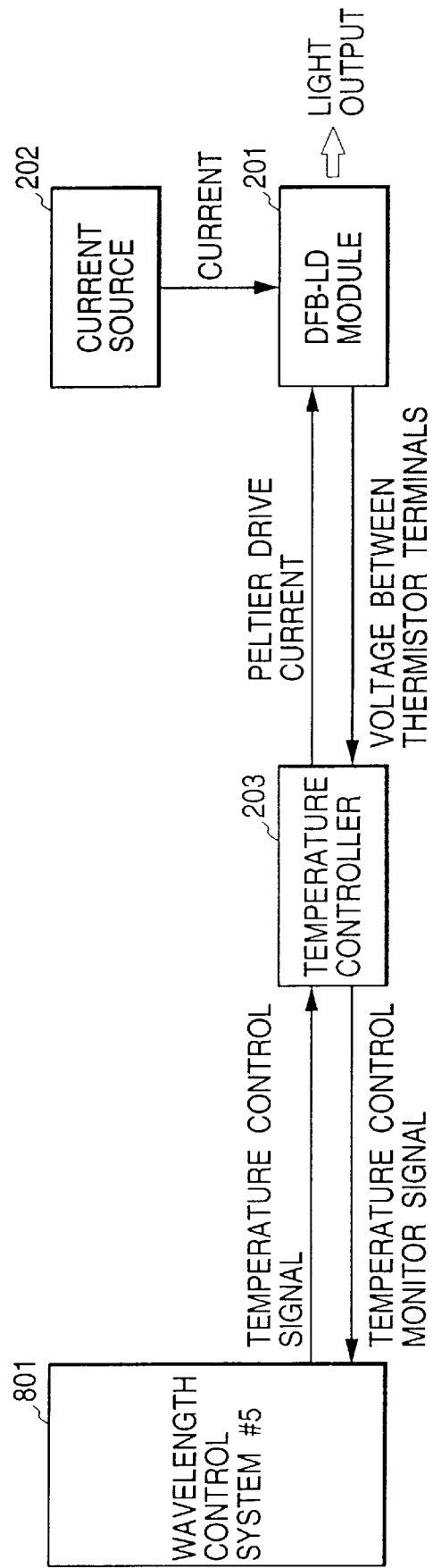
FIG. 8 is a view illustrating the structure of a second conventional art wavelength-changeable light source.
Figure 9A:
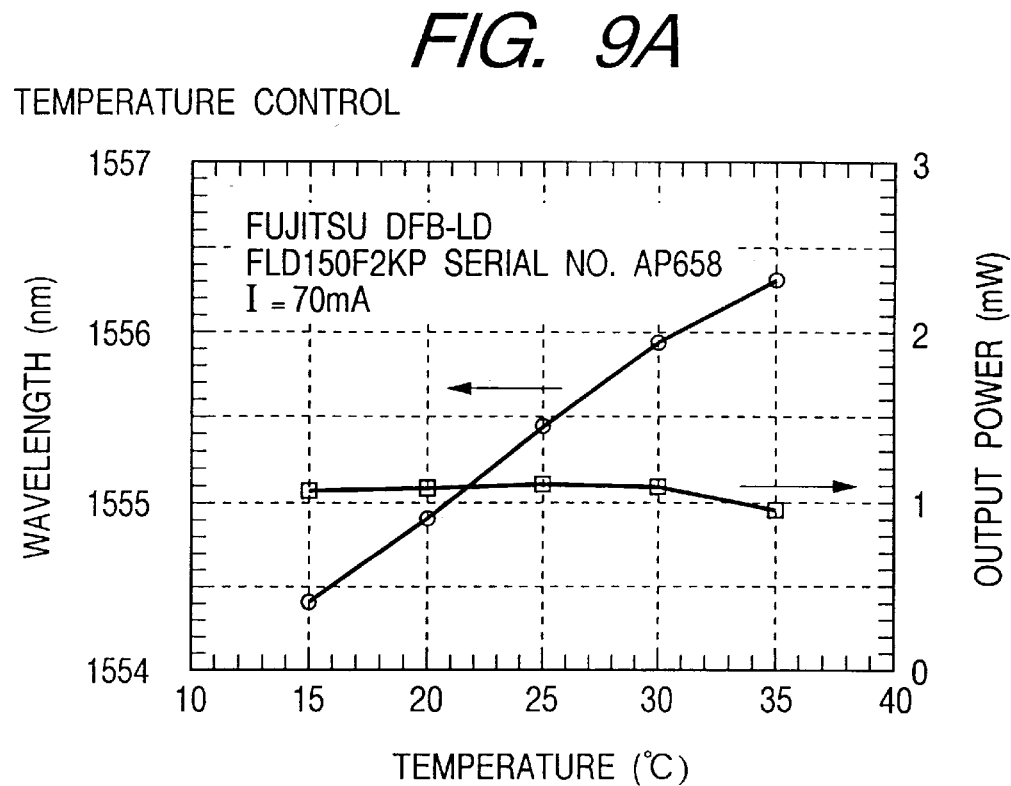
FIG. 9A is a graph showing the temperature-to wavelength characteristic of a single-electrode DFB-LD.
Figure 9B:
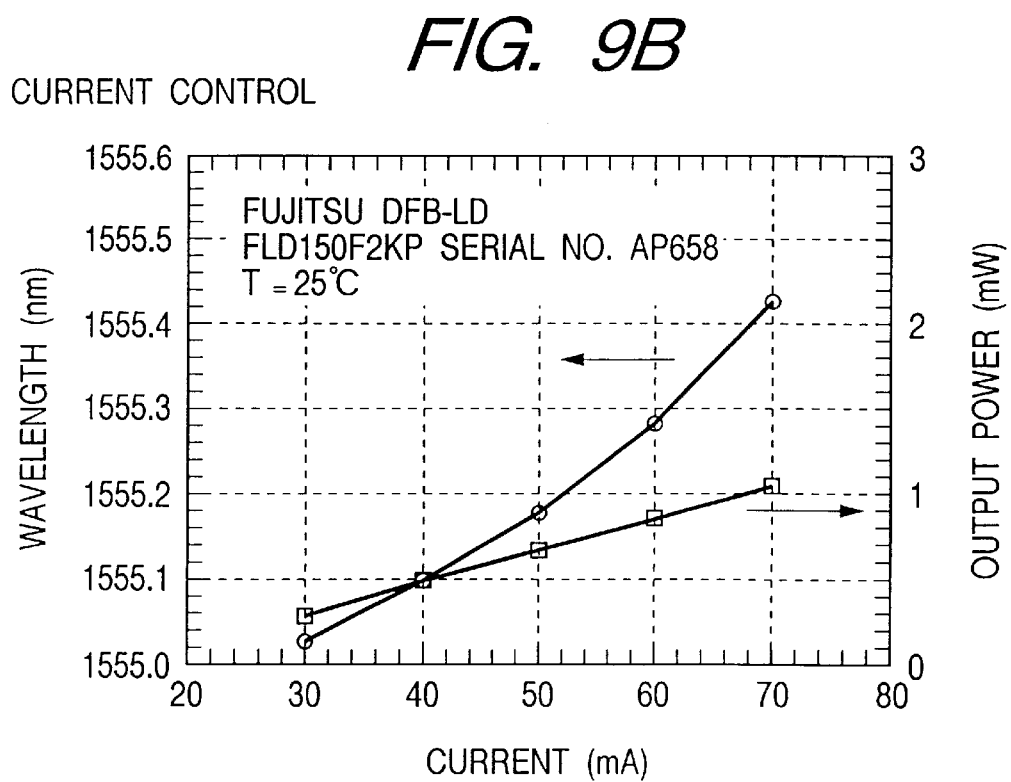
FIG. 9B is a graph showing the current-to wavelength characteristic of a single-electrode DFB-LD.

Further, the other structure of this embodiment is approximately the same as the structure of the conventional art device illustrated in FIG. 8. However, this embodiment is different therefrom in that the wavelength control system #1 (204) controls the output current of the current source 201. The wavelength control system #1 (204) is provided with a CPU, a memory and so forth, and controls the lasing wavelength of the DFB-LD module 201 by outputting the current control signal and the temperature control signal. Further, in the memory of the wavelength control system #1 (204), amounts of changes in the temperature control signal and the current control signal required for a given wavelength shift, operation procedures and timings for performing the wavelength control operation of this embodiment and the like are stored. It is assumed herein that the wavelength of the DFB-LD module 201 shifts toward a longer wavelength side as the current increases and as the temperature rises.

In this embodiment, the wavelength control operation in the wavelength shift control is divided into two stages. Initially, the current control signal is supplied from the wavelength control system #1 (204) to the current source 202, and the wavelength of the single-electrode DFB-LD module 201 is shifted on the basis of the current control signal (this period will be referred to as a first period hereinafter). Then, the temperature controller 203 supplies the Peltier drive current to the Peltier element in the single-electrode DFB-LD module 201 on the basis of the temperature control signal from the wavelength control system #1 (204) to shift the lasing wavelength of the DFB-LD. This wavelength shift gradually replaces the amount of the wavelength shift caused by the precedent current control signal (this period will be referred to as a second period hereinafter).

Here, the length of the first period is determined by the amount of the wavelength shift and time required for the wavelength control system #1 (204) to control the current source 202, and the length of this period is approximately equal to 0.001 to 1 second. The length of the second period is determined by the amount of the wavelength shift and time required for the temperature controller 203 to control the temperature of the DFB-LD module 201 to a set temperature. This length ranges from the order of a second to the order of a minute. The amount of the current from the current source 202 reaches a predetermined value I0 on completion of each wavelength shift control. Here, the current I0 is an injection current at the time when the DFB-LD module 201 is in its oscillated state. In FIG. 1, the setting of a wavelength prior to and subsequent to the wavelength shift control is placed at a center of the wavelength-changeable range of the DFB-LD which can be attained by the current control.

In FIG. 1, the wavelength shift control for shifting the lasing wavelength of the DFB-LD to a longer wavelength side is performed three times. In the wavelength shift control #1, the wavelength shift control is started at time T11 and finished at time T13. The wavelength of the DFB-LD module 201 is shifted by $\lambda S1$ to a longer wavelength side by that wavelength shift control #1. During a period from time T11 to time T12, the wavelength control system #1 (204) increases the output current of the current source 202 and shifts the wavelength of the DFB-LD module 201 by $\lambda S1$ to a longer wavelength side. Then, during a period between time T12 and T13, the wavelength control system #1 (204) performs the current control of gradually decreasing the output current of the current source 202 and the temperature control of increasing the set temperature of the temperature controller 203, simultaneously. The control is conducted gradually. As a result, during the period between time T12 and time T13, the lasing wavelength of the DFB-LD module 201 is shifted $\lambda S1$ to a shorter wavelength side by the current control while shifted $\lambda S1$ to a longer wavelength side by the temperature control. Resultantly, the wavelength is maintained at $\lambda S1$ which is reached by the wavelength shift to a longer wavelength side during the period from time T11 to time T12. On completion of the wavelength shift control #1, the wavelength is shifted by $\lambda S1$ to a loner wavelength side, the temperature of the DFB-LD module 201 is increased and the current is returned to the value I0 prior to the control.

The same operation is executed in each of the wavelengthes shift control #2 and the wavelength shift control #3, and the wavelength are respectively shifted $\lambda S2$ and $\lambda S3$ to a longer wavelength side (here, the amount of the wavelength shift obtained in the wavelength shift control #2 is equal to the maximum value $\lambda Imax$ of the wavelength shift to a longer wavelength side which can be attained by the current control). Time required for the wavelength shift control increases as the amount of the wavelength shift increases. Therefore, since $\lambda S2 > \lambda S1 > \lambda S3$ in FIG. 1, the following relations exist:

(T22–T21)>(T12–T11)>(T32–T31)

and (T23–T22)>(T13–T12)>(T33–T32)

After the wavelength shift control is performed three times, the wavelength of the DFB-LD module 201 is shifted to a longer wavelength side by the following amount:

$\lambda S1 + \lambda S2 + \lambda S3$

The lasing wavelength of the DFB-LD module 201 can be changed over a wide wavelength-changeable range, which can be obtained by the temperature control, by repeating the wavelength shift control. Further, the wavelength shift can also be performed in a short time in a narrow wavelength-changeable range which can be attained by the current control. Namely, the wavelength control system #1 (204) shifts the lasing wavelength of the DFB-LD in a short time by supplying to the current source 202 the current control signal corresponding to a desired amount of the wavelength shift, then increases the temperature control signal while gradually decreasing the current control signal with the lasing wavelength being maintained, and thus maintains the wavelength shift. This operation is the same in each of the wavelength shift controls #1 to #3.

In the foregoing, there is described the example for shifting the lasing wavelength to a longer wavelength side, but the operation is also the same where the wavelength is to be shifted to a shorter wavelength side. Further, the operation is the same even when the wavelength is to be alternately shifted to a shorter wavelength side and to a longer wavelength side. For example, when an instruction for shifting the wavelength by $\lambda S4$ to a shorter wavelength side is given subsequent to the wavelength shift control #1, the wavelength control system #1 (204) shifts the wavelength to $\lambda S1$ to $\lambda S4$ in a short time by supplying the current control signal, which causes a decrease of the current to a given current, to the current source 202. Then the wavelength control system #1 decreases the temperature control signal while gradually increasing the current control signal such that the lasing wavelength is maintained at the value of $\lambda S1$ to $\lambda S4$. Also in this case, the value of the current from the current source 202 to the DFB-LD caused by the current control signal at the time of the oscillation at the wavelength value of $\lambda S1$ to $\lambda S4$ is equal to an original value of the current from the current source 202 at the time of the oscillation at an original wavelength, and the Peltier drive current has the amount of a current corresponding to the wavelength value of $\lambda S1$ to $\lambda S4$.

Furthermore, in the above embodiment, though an example of the wavelength shift in a short time is described using a low-cost single-electrode DFB-LD module, any ordinary semiconductor laser (LD) can also be used by constructing and operating this ordinary LD similarly to the above embodiment, if the lasing wavelength of this ordinary LD can be changed by the application of a current and the setting of temperature.

[Second Embodiment]

A second embodiment of the present invention will be described with reference to FIG. 3.

Figure 3:
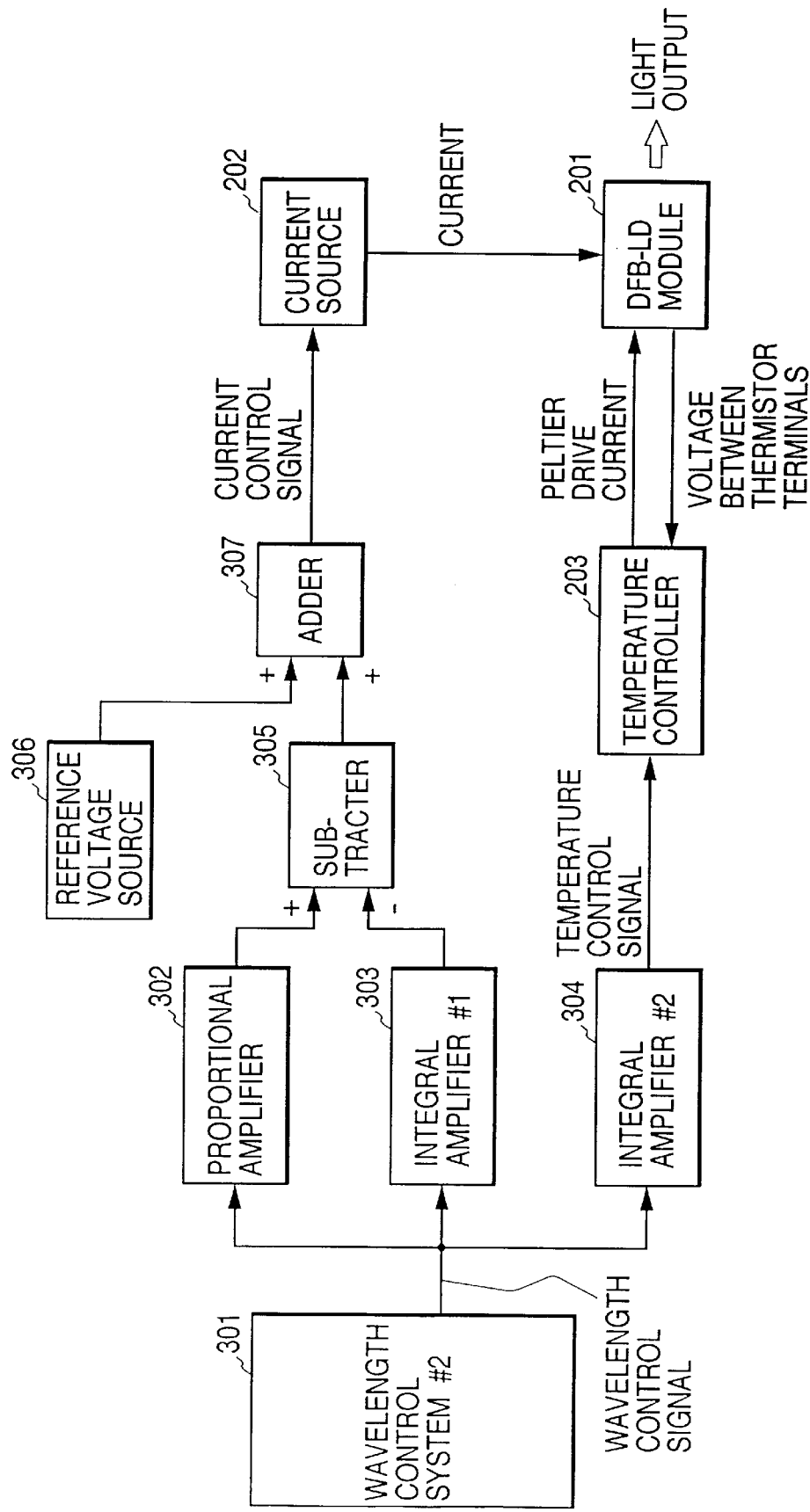
FIG. 3 is a view illustrating the structure of a second embodiment of a wavelength-changeable light source according to the present invention.

FIG. 3 illustrates the structure of a wavelenth-changeable light source of the second embodiment. The second embodiment is comprised of a single-electrode DFB-LD module 201, a current source 202, a temperature controller 203, a wavelength control system #2 (301), a proportional amplifier 302, an integral amplifier #1 (303), an integral amplifier #2 (304), a subtracter 305, a reference voltage source 306 and an adder 307.

The DFB-LD module 201, the current source 202 and the temperature controller 203 are the same as those of the first embodiment illustrated in FIG. 2. The wavelength control system #2 (301) is approximately the same as the wavelength control system #1 (204) in FIG. 2. While the wavelength control system #1 (204) directly controls the current source 202 and the temperature controller 203, the wavelength control system #2 (301) indirectly controls the current source 202 and the temperature controller 203 through an analog arithmetic circuit.

The proportional amplifier 302, the integral amplifier #1 (303), the integral amplifier #2 (304), the subtracter 305, the reference voltage source 306 and the adder 307 constitute the analog arithmetic device of the second embodiment, which is a key portion. The proportional amplifier 302 is an amplifier whose band is from DC to the order of MHz. The amplification factor of the proportional amplifier 302, into which the wavelength control signal is input, is set such that the wavelength control system #2 (301) can control the wavelength of the DFB-LD module 201 to a predetermined value. The integral amplifier #1 (303) is an amplifier which is designed such that its integration time is in the order of 0.1 to 1 second, the wavelength control signal is input thereinto and its output comes to have the same value as that of the output of the proportional amplifier 302 after the integration time has passed. The integral amplifier #2 (304) is an integrator whose integration time is the same as that of the integral amplifier #1 (303). Its amplification factor is designed such that the wavelength control system #2 (301) can control the wavelength of the DFB-LD module 201 to a predetermined value. The wavelength control signal is input into the integral amplifier #2 (304) and the integral amplifier #2 (304) outputs the temperature control signal to the temperature controller 203. Further, the subtracter 305 subtracts a voltage at its negative (−) input terminal from a voltage at its positive (+) input terminal and outputs its result. The output of the proportional amplifier 302 is input into the positive input terminal of the subtracter 305 and the output of the integral amplifier #1 (303) is input into the negative input terminal of the subtracter 305. The reference voltage source 306 functions to maintain the output current of the current source 202 above a predetermined current I0. The adder 307 adds the outputs of the reference voltage source 306 and the subtracter 305, i.e., voltages at its two input terminals, and outputs its result to the current source 202 as the current control signal.

In the second embodiment, the controls of the current source 202 and temperature controller 203 during the wavelength shift control are not directly performed by the wavelength control system while the timing is measured, but are performed by the current control signal and the temperature control signal which are generated from the wavelength control signal from the wavelength control system #2 (301) by the analog operation in the electric circuit.

The wavelength control system #2 (301) performs the wavelength shift control by increasing (or decreasing) the wavelength control signal and then maintaining its value at a constant value. A case where the wavelength control signal is increased and the wavelength is shifted to a longer wavelength side will be described.

When the wavelength control signal is increased, the output of the proportional amplifier 302 increases, then the current control signal increases and the wavelength of the DFB-LD module 201 shifts to a longer wavelength side. Concurrently therewith, the outputs of the integral amplifier #1 (303) and the integral amplifier #2 (304) gradually increase, the current control signal gradually decreases and the temperature control signal gradually increases. As a result, the previous shift of the wavelength to a longer wavelength side by the current control is gradually replaced with the wavelength shift by the temperature control. After the integration times of the integral amplifier #1 (303) and the integral amplifier #2 (304) have passed, the current control signal comes to the output voltage of the reference voltage source 306 and the output current of the current source 202 is maintained at I0. On the other hand, the temperature control signal is increased by the amount corresponding to the wavelength shift.

Since the wavelength shift control equivalent to the operation example in FIG. 1 is executed by the analog operation in the second embodiment, a simpler wavelength control system can be used. Further, in the second embodiment, there is described the example wherein the wavelength control system #2 (301) does not monitor the temperature control monitor signal, which is different from the first embodiment, but the temperature control may be more accurately performed by conducting monitoring and feedback operation. Either temperature control may be adopted.

[Third Embodiment]

A third embodiment of the present invention will be described with reference to FIG. 4.

In the third embodiment, the wavelength-changeable light source and the method of controlling the wavelength changing established according to the present invention are applied to a wavelength control system used in a wavelength division multiplexing communication network.

Figure 4:
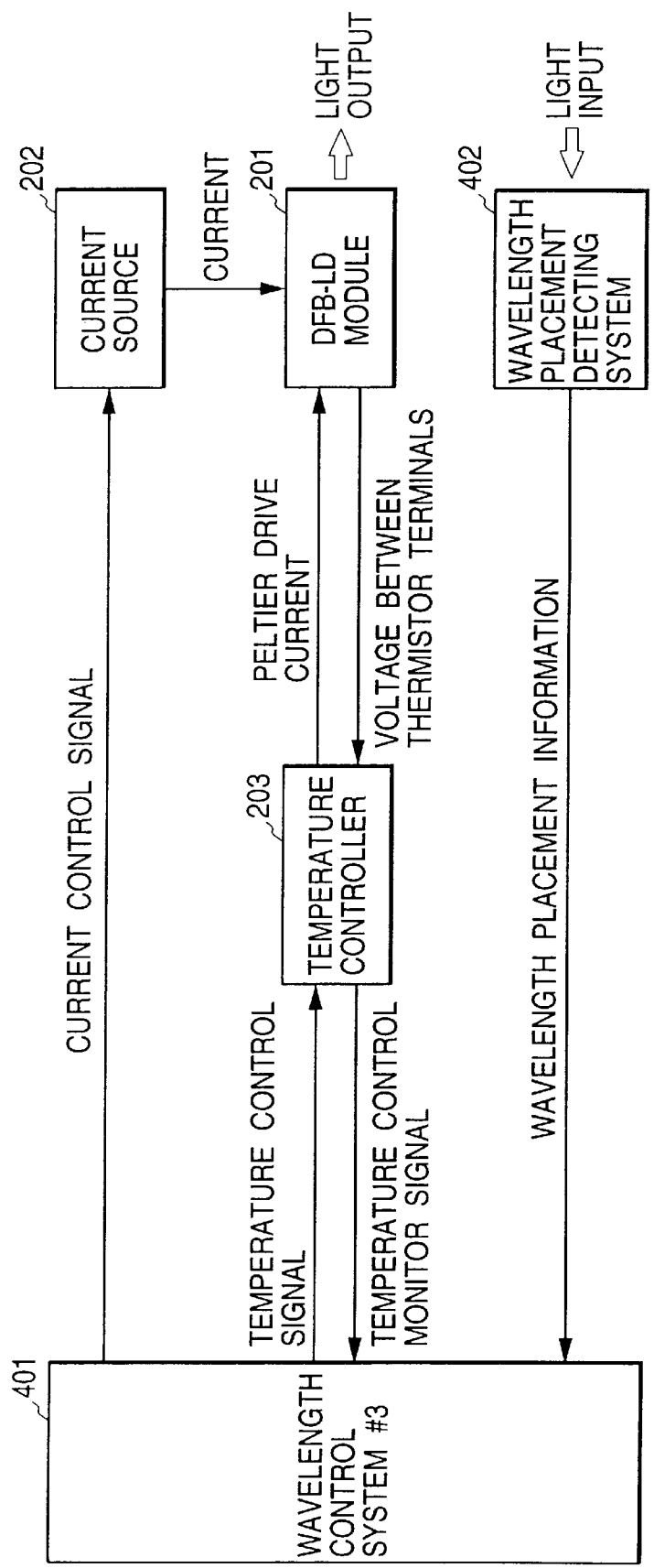
FIG. 4 is a view illustrating the structure of a third embodiment of a wavelength-changeable light source according to the present invention.

FIG. 4 illustrates the structure of the third embodiment of a wavelength-changeable light source. There are arranged a single-electrode DFB-LD module 201, a current source 202, a temperature controller 203, a wavelength control system #3 (401) and a wavelength-placement detecting system 402. The structure other than the wavelength control system #3 (401) and the wavelength-placement detecting system 402 is the same as that of the first embodiment illustrated in FIG. 2.

The wavelength control system #3 (401) adjusts the current control signal and the temperature control signal on the basis of the wavelength-placement information and controls the wavelength of the DFB-LD module 201. The construction of the third embodiment is the same as that of the first embodiment with the exception that an input terminal for the wavelength-placement information is provided and the lasing wavelength of the DFB-LD module 201 is controlled on the basis of the wavelength-placement information.

The wavelength-placement detecting system 402 detects the wavelength placement on a transmission line in the wavelength division multiplexing communication network, and inputs the wavelength-placement information into the wavelength control system #3 (401). The wavelength-placement detecting system 402 can be comprised of an optical filter, such as a fiber Fabry-Perot filter, whose transmission wavelength can be controlled by a voltage control thereto, a control system therefor and an optical detecting system, for example. The wavelength-placement detecting system 402 sweeps its transmission wavelength when the control voltage applied thereto is swept by the wavelength control system #3 (401), and detects the wavelength placement from the placement in time of a train of pulses of electric signals (corresponding to the placement in wavelength of the lasing wavelengths on the transmission line) supplied from the optical detecting system.

FIGS. 5A, 5B, 5C, 5D, 5E, 5F and 5G respectively illustrate the operations of the wavelength control of the third embodiment. Its abscissa indicates the wavelength and positions of vertical lines extending along its ordinate indicate the placement of the wavelengths. A series of seven states are shown and the manners of control are illustrated in FIGS. 5A, 5B, 5C, 5D, 5E, 5F and 5G. In each operation, the wavelength control by the current (the current control) and the wavelength control by the temperature (the temperature control) are illustrated. In FIGS. 5A, 5B, 5C, 5D, 5E, 5F and 5G, $\lambda O$ is a wavelength of the wavelength-changeable light source in an optical node which is an object node to be described later, $\lambda A1$, $\lambda A2$ and $\lambda B$ are respectively wavelengths of wavelenth-changeable light sources in other optical nodes which will also be described later and $\Delta\lambda$ is a channel interval between adjacent wavelengths in the wavelength division multiplexing communication network.

Figure 6:
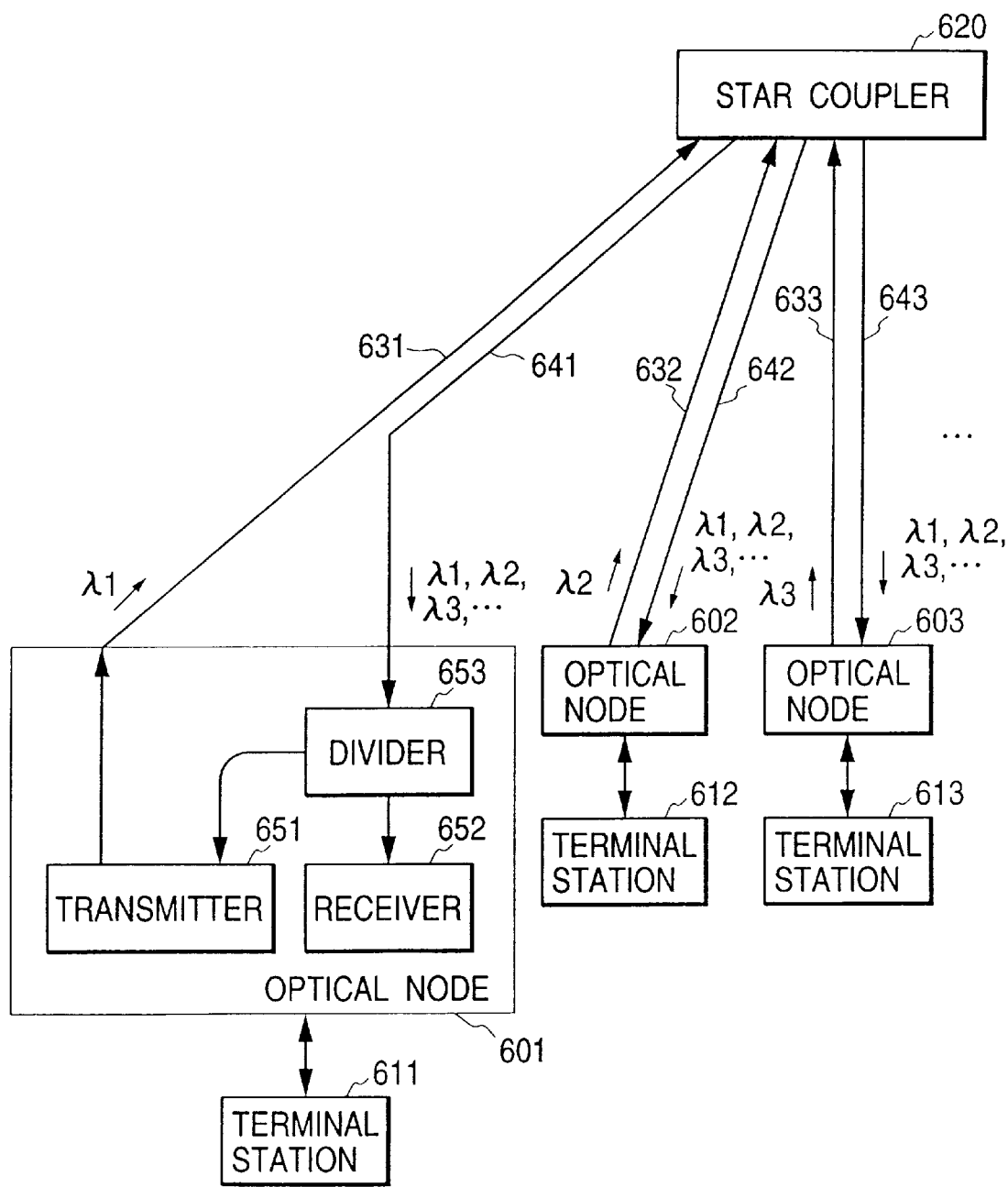
FIG. 6 is a block diagram illustrating the structure of a wavelength division multiplexing communication network according to the present invention.
Figure 7:
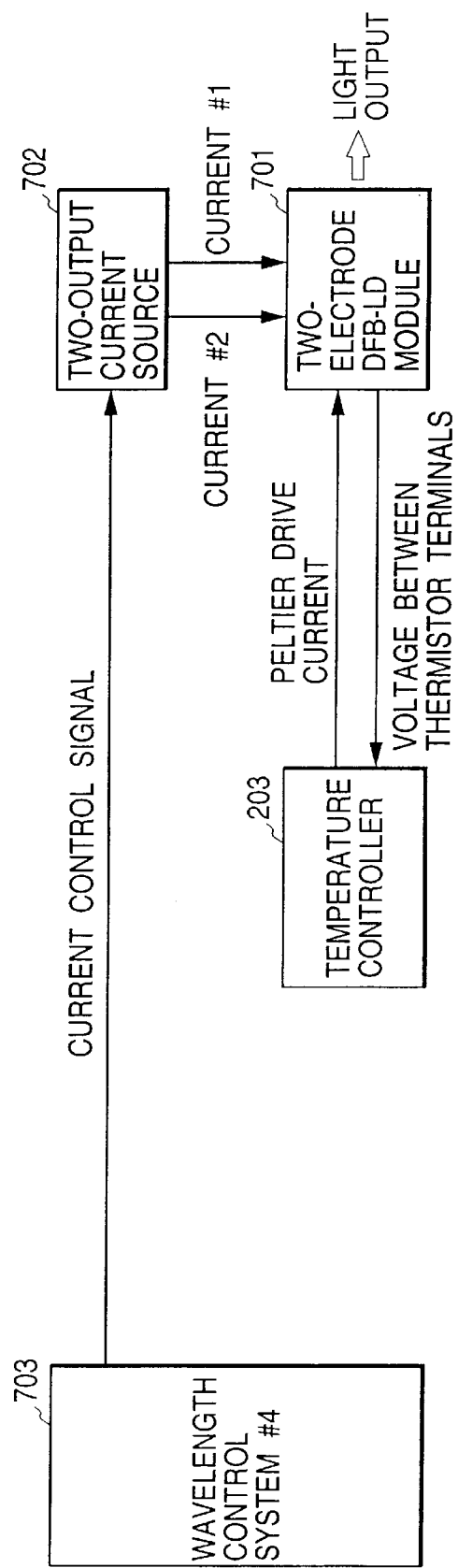
FIG. 7 is a view illustrating the structure of a first conventional art wavelength-changeable light source.

FIG. 6 illustrates the structure of the wavelength division multiplexing communication network. In FIG. 6, optical nodes 601, 602 and 603, terminal stations 611, 612 and 613, a star coupler 620 and optical fibers 631, 632, 633, 641, 642 and 643 constitute the communication network. Each optical node includes an optical transmitter 651, an optical receiver 652 and a power divider 653. The optical transmitter 651 includes the wavelength-changeable light source illustrated in FIG. 4. For simplicity of illustration, only three nodes are shown in FIG. 6, but more terminal stations and optical nodes may be arranged in the network of FIG. 6.

The terminal station 611 performs communication with another terminal station through the optical node 601. An optical signal from the optical transmitter 651 in the optical node 601 is sent to the star coupler 620 through the optical fiber 631, is power-divided into portions transmitted through the optical fibers 641, 642 and 643 and reaches the optical nodes including its own optical node 601. The optical signal from the optical transmitter 651 is output into the optical fiber 631, and the optical signal from the optical fiber 641 is power-divided at the power divider 653 and input into the optical transmitter 651 and the optical receiver 652. This is the same with regard to other terminal stations and optical nodes.

$\lambda 1$, $\lambda 2$ and $\lambda 3$ are wavelengths of wavelength-changeable light sources in the optical transmitters 651 of the optical nodes 601, 602 and 603, respectively.

In the wavelength division multiplexing communication network, only the optical node, which performs communication, emits light and uses the wavelength range of wavelength multiplexing. To use this wavelength range effectively, the wavelength control system #3 (401) of the wavelength-changeable light source in each optical node detects the wavelength interval between its own wavelength and an adjacent wavelength thereto by using the wavelength-placement detecting system 402, and maintains this wavelength interval at $\Delta\lambda$. When the wavelength interval is measured from the adjacent wavelength on a longer wavelength side, lasing wavelengths are placed or arranged at the interval of $\Delta\lambda$ from a longer wavelength side in the order of emission-start times.

Communication by each terminal station and each optical node in the wavelength multiplexing communication network illustrated in FIG. 6, particularly an example of the control operations of each optical node and the lasing wavelength of the wavelength-changeable light source (shown in FIG. 4) in the optical transmitter of each node, will be described with reference to FIGS. 5A, 5B, 5C, 5D, 5E, 5F and 5G.

FIG. 5A shows a steady state. It is assumed that when the wavelength-changeable light source in the optical node, which is the object node to be described, starts oscillation, there already exist ten wavelengths (including $\lambda A1$, $\lambda A2$ and $\lambda B$) on the transmission line of the optical fibers 641 to 643 at the wavelength interval of $\Delta\lambda$ from a longer wavelength side in the wavelength range. This wavelength-changeable optical transmitter emits light of an eleventh wavelength (this eleventh wavelength of this wavelength-changeable optical transmitter is denoted by $\lambda O$), and maintains the wavelength interval between the eleventh wavelength and the adjacent wavelength $\lambda A1$ at $\Delta\lambda$. The control for maintaining the wavelength interval during the steady state is performed only by the current control from the current source 202 to the DFB-LD module 201 since the amount of the wavelength shift is small during the steady state.

FIG. 5B illustrates a state in which the emission of the wavelength $\lambda A1$ on a longer wavelength side of the wavelength $\lambda O$ is stopped and hence the wavelength of $\lambda O$ is being shifted to bring the wavelength interval between this wavelength and the wavelength $\lambda A2$ into $\Delta\lambda$. This wavelength shift is performed during the first period of the wavelength shift control described in the first embodiment or the second embodiment. For example, the wavelength is shifted to a longer wavelength side by the current control, such as the current controls between times T11 and T12, between times T21 and T22 and so forth, and the temperature control is constantly unchanged.

FIG. 5C shows a quasi-steady state in which the second period of the wavelength shift control is started, such as the periods between times T12 and T13, between times T22 and T23 and so forth. The temperature is gradually raised and concurrently the current value is gradually returned to the original value I0. Since the wavelength interval between $\lambda O$ of its own terminal station and the wavelength $\lambda A2$ of the adjacent terminal station is measured by the wavelength-placement detecting system 402, the wavelength control system #3 (401) can perform the control without knowing details of the lasing wavelength characteristics of the DFB-LD module 201 relative to the current and the temperature beforehand.

The replacement of the current control with the temperature control will be conducted as follows. The detection of the wavelength placement and the wavelength control (in this case, the replacement of the current control with the temperature control) are repeated until the current value reaches I0. In each wavelength control, the current is decreased by a minute amount Is and the set temperature is increased by a minute amount Ts. The amount of the wavelength shift of the DFB-LD module 201 relative to Is is about equal to the amount of the wavelength shift of the DFB-LD module 201 relative to Ts. When the wavelength-placement detecting system detects the fact that the wavelength interval from the adjacent wavelength becomes narrow, no temperature control is performed and the current is decreased by Is by the current control during the next wavelength control. Conversely, when the wavelength interval from the adjacent wavelength becomes wide, no current control is executed and the set temperature is increased by Ts by the temperature control during the next wavelength control.

FIG. 5D again illustrates the steady state in which the lasing wavelength of the optical transmitter in each node is stably maintained, such as the periods between times T13 and T21, between times T23 and T31 and so forth in FIG. 1. The situation is the same as that of FIG. 5A except that the adjacent wavelength is $\lambda A2$ and the lasing wavelength of its own terminal station is a tenth wavelength. In this state, the wavelength interval from the adjacent wavelength on a longer wavelength side is maintained at $\Delta\lambda$ by the current control.

FIG. 5E shows a state in which the oscillation at $\lambda B$ on a longer wavelength side of $\lambda A2$ is stopped and the wavelength $\lambda A2$ is being shifted to a longer wavelength side. Hence, this is the state in which the wavelength of $\lambda O$ is also being shifted to a longer wavelength side such that the wavelength interval from $\lambda A2$ is brought to $\Delta\lambda$. This wavelength shift is conducted during the first period in the wavelength shift control. Namely, the optical transmitters in the respective optical nodes, whose lasing wavelengths are respectively $\lambda O$ and $\lambda A2$, shift their wavelengths to a longer wavelength side by the current control, and maintain the temperature control constantly.

FIG. 5F shows the quasi-steady state in which the optical transmitters in the respective nodes, whose lasing wavelengths are respectively λO and λA2, gradually increase their temperatures and concurrently gradually return their current values to the original value I0. The wavelength changing control operation of the optical transmitter in each optical node is the same as the steady state of FIG. 5C except that their wavelengths are respectively eighth and ninth wavelengths, and a minute wavelength control is maintained by the current control.

FIG. 5G illustrates the steady state in which the operation is performed by the current control such that the wavelength interval between the lasing wavelength of the optical transmitter in each node and its adjacent wavelength is maintained at the wavelength interval of Δλ, similarly to the cases illustrated in FIGS. 5A and 5D.

Since the wavelength interval Δλ is approximately 0.04 nm and the ratio of a change in the wavelength relative to the current of the DFB-LD module is approximately 0.008 nm/mA, for example, the wavelength shifts in FIGS. 5B and 5E can be achieved by the current which is sufficiently obtained by the current control. Therefore, time required for the wavelength shift can be shortened, and the period of a state having the wavelength interval longer than Δλ can be shortened. Further, the varied current is returned to the original value during the steady state, so that the apparatus can respond to a next wavelength shift promptly.

Further, the ratio of a change in the wavelength relative to the temperature of the DFB-LD module is about 0.08 nm/° C. Since the temperature can be certainly changed over a range of about 20° C., the wavelength-changeable range of about 1.6 nm can be obtained by the temperature control.

When the wavelength-changeable light source of the present invention is used in the above wavelength control system, the wavelength division multiplexing communication network with about 40 (forty) channels can be built without using a high-cost multi-electrode wavelength-changeable LD.

[Other Embodiments]

In the above embodiments, a single-electrode DFB-LD module is used as the LD of the wavelength-changeable light source, but it is possible to use other LDs whose temperature can be changed. For example, "Heaters On Passive Region Employed (HOPE) DBR-LD" (Japanese Academy of Electronics Information Communications, Autumnal Meeting, 1992, Lecture No. C-149) can be used. This LD is a DBR-LD having a heater electrode formed in its wavelength control region.

In the above description, explanation is made by stating that the current value I0 before and after the wavelength shift control is constant, but it is possible to change this I0 depending on the situation of the temperature control. For example, it is possible to perform a control method in which the current value I0 is increased as the temperature increases in order to maintain the light output of the DFB-LD module at a constant intensity.

In the above description, the DFB-LD module has characteristics that the wavelength shifts to a longer wavelength side as the current increases and as the temperature rises, but the present invention can be practiced by using the LD with another characteristic.

In the first embodiment, explanation is made by stating that the lasing wavelength before and after the wavelength shift control is set at a center of the wavelength-changeable range which can be obtained by the current, but this lasing wavelength may be set at any place in the wavelength-changeable range. For example, where the wavelength-changeable light source of the present invention is used in a wavelength control system in which the wavelength is shifted exclusively to a longer wavelength side, the lasing wavelength before and after the wavelength shift control can be set at a shortest wavelength edge of the wavelength-changeable range attainable by the current control to widen a wavelength range over which the lasing wavelength can be speedily shifted.

In the first embodiment, the period (the first period) of the wavelength shift by the current control is clearly separated from the period (the second period) of the replacement of the current control by the temperature control, but it is possible to adopt a control system in which those periods are not clearly separated from each other. Specifically, it is possible to adopt a control system in which the first period of a next wavelength shift control is started during the second period of a precedent wavelength shift control.

In the third embodiment, the lasing wavelengths of the wavelength division multiplexing communication network are placed from a longest wavelength edge to a shorter wavelength side of the wavelength range, but another method of the wavelength placement can be used. For example, the wavelengths can be placed from a shortest wavelength edge of the wavelength range.

Further, in the above embodiment, the first embodiment is used as the wavelength-changeable light source, but the wavelength-changeable light source of the second embodiment can be used similarly.

As described in the foregoing, according to the present invention, it is possible to provide a low-cost wavelength-changeable light source with a short response time and a wide wavelength-changeable range. Further, according to the control method of the wavelength-changeable light source, the wavelength shift control by the current control, in which the wavelength can be changed in a short time, is combined with the wavelength shift control executed by the temperature control to cancel the current control. Thus, data communication can be performed among many terminal stations in a wavelength division multiplexing communication network system with a low-cost construction.

What is claimed is:

1. A wavelength-changeable source comprising:
   a laser;
   first control means for controlling a lasing wavelength of said laser with a first response time; and
   second control means for controlling the lasing wavelength of said laser with a response time which is longer than the first response time, wherein control by said first control means of an amount of a change in the lasing wavelength is replaced by control by said second control means of the amount of change in the lasing wavelength while retaining the amount of change in the lasing wavelength executed by said first control means.

2. A wavelength-changeable light source according to claim 1, wherein said first and second control means continuously control the lasing wavelength.

3. A wavelength-changeable light source according to claim 1, wherein said laser comprises a semiconductor laser.

4. A wavelength-changeable light source according to claim 3, wherein said first control means comprises current control means for controlling a current supplied to said semiconductor laser.

5. A wavelength-changeable light source according to claim 3, wherein said second control means comprises temperature control means for controlling temperature of said semiconductor laser.

6. A wavelength-changeable light source according to claim 3, wherein said first control means comprises current control means for controlling a current supplied to said semiconductor laser, and said second means comprises temperature control means for controlling temperature of said semiconductor laser.

7. A wavelength-changeable light source according to claim 1, further comprising an analog arithmetic circuit for controlling said first control means and said second control means.

8. A wavelength-changeable light source according to claim 1, further comprising wavelength-placement detecting means for detecting placement of wavelengths on a transmission line to which output light of said laser is output, and wherein said first control means and said second control means perform controls on the basis of wavelength-placement information obtained from said wavelength-placement detecting means, respectively.

9. A wavelength-changeable light source comprising:
a semiconductor laser;
current control means for controlling a lasing wavelength of said semiconductor laser by controlling a current supplied to said semiconductor laser; and
temperature control means for controlling the lasing wavelength of said semiconductor laser by controlling a temperature of said semiconductor laser, wherein control by said current control means of an amount of a chance in the lasing wavelength is replaced by control by said temperature control means of the amount of chance in the lasing wavelength while retaining the amount of change in the lasing wavelength executed by said current control means.

10. A wavelength-changeable light source according to claim 9, wherein said current control means and said temperature control means continuously control the lasing wavelength.

11. A wavelength-changeable light source according to claim 9, further comprising an analog arithmetic circuit for controlling said current control means and said temperature control means.

12. A wavelength-changeable light source according to claim 9, further comprising wavelength-placement detecting means for detecting placement of wavelengths on a transmission line to which output light of said laser is output, and wherein said current control means and said temperature control means perform controls on the basis of wavelength-placement information obtained from said wavelength-placement detecting means, respectively.

13. An optical communication network for performing communication by using light, said network comprising:
a transmission line for transmitting light therethrough; and
a wavelength-changeable light source for outputting light to said transmission line, said light source including:
a laser;
first control means for controlling a lasing wavelength of said laser with a first response time; and
second control means for controlling the lasing wavelength of said laser with a response time which is longer than the first response time, wherein control by said first control means of an amount of a change in the lasing wavelength is replaced by control by said second control means of the amount of change in the lasing wavelength while retaining the amount of change in the lasing wavelength executed by said first control means.

14. An optical communication network according to claim 13, wherein said wavelength-changeable light source further includes wavelength-placement detecting means for detecting placement of wavelengths on said transmission line, and wherein said first control means and said second control means perform controls on the basis of wavelength-placement information obtained from said wavelength-placement detecting means, respectively.

15. An optical communication network according to claim 14, wherein said first and second control means perform such a control that an interval between a wavelength adjacent to the wavelength of output light of said laser in the wavelength placement on said transmission line and the wavelength of the output light of said laser is maintained at a predetermined interval.

16. An optical communication network for performing communication by using light, said network comprising:
a transmission line for transmitting light therethrough; and
a wavelength-changeable light source for outputting light to said transmission line, said light source including:
a semiconductor laser;
current control means for controlling a lasing wavelength of said semiconductor laser by controlling a current supplied to said semiconductor laser; and
temperature control means for controlling the lasing wavelength of said semiconductor laser by controlling a temperature of said semiconductor laser, wherein control by said current control means of an amount of a change in the lasing wavelength is replaced by control by said temperature control means of the amount of change in the lasing wavelength while retaining the amount of change in the lasing wavelength executed by said current control means.

17. An optical communication network according to claim 16, wherein said wavelength-changeable light source further includes wavelength-placement detecting means for detecting placement of wavelengths on said transmission line, and wherein said current control means and said temperature control means perform controls on the basis of wavelength-placement information obtained from said wavelength-placement detecting means, respectively.

18. An optical communication network according to claim 17, wherein said current control means and said temperature control means perform such a control that an interval between a wavelength adjacent to the wavelength of output light of said laser in the wavelength placement on said transmission line and the wavelength of the output light of said laser is maintained at a predetermined interval.

19. A wavelength control method for controlling a wavelength of output light from a semiconductor laser,
controlling a current supplied to the semiconductor laser to change the wavelength of the output light; and
controlling a temperature of the semiconductor laser to replace control by the current control of an amount of a change in the wavelength with control by the temperature control of the amount of the change in the wavelength while retaining the amount of the change in the wavelength executed by the current control.

20. A wavelength control method according to claim 19, wherein the change in the wavelength executed by the current control is a predetermined amount of a change in the wavelength.

21. A wavelength-changeable light source according to claim 9, wherein said semiconductor laser is a single-electrode DFB-LD module.

22. A wavelength-changeable light source according to claim 21, wherein said temperature control means is operated by a Peltier element contained in said single-electrode DFB-LD module.

23. A wavelength-changeable light source according to claim 1, wherein the control by said second control means is performed after the lasing wavelength is changed by said first control means.

24. A wavelength-changeable light source according to claim 1, wherein the control by said second control means is not performed when the lasing wavelength is changed by said first control means.

25. A wavelength-changeable light source according to claim 23, wherein the control by said second control means is not performed when the lasing wavelength is changed by said first control means.

26. A wavelength-changeable light source according to claim 9, wherein the control by said temperature control means is performed after the lasing wavelength is changed by said current control means.

27. A wavelength-changeable light source according to claim 9, wherein the control by said temperature control means is not performed when the lasing wavelength is changed by said current control means.

28. A wavelength-changeable light source according to claim 26, wherein the control by said temperature control means is not performed when the lasing wavelength is changed by said current control means.

29. An optical communication network according to claim 13, wherein the control by said second control means is performed after the lasing wavelength is changed by said first control means.

30. An optical communication network according to claim 13, wherein the control by said second control means is not performed when the lasing wavelength is changed by said first control means.

31. An optical communication network according to claim 29, wherein the control by said second control means is not performed when the lasing wavelength is changed by said first control means.

32. An optical communication network according to claim 16, wherein the control by said temperature control means is performed after the lasing wavelength is changed by said current control means.

33. An optical communication network according to claim 16, wherein the control by said temperature control means is not performed when the lasing wavelength is changed by said current control means.

34. An optical communication network according to claim 32, wherein the control by said temperature control means is not performed when the lasing wavelength is changed by said current control means.

35. A wavelength-changeable light source comprising:

a semiconductor laser;

current control means for controlling a lasing wavelength of said semiconductor laser by controlling a current supplied to said semiconductor laser; and temperature control means for controlling the lasing wavelength of said semiconductor laser by controlling a temperature of said semiconductor laser, wherein, after the lasing wavelength is changed by said current control means, control by said current control means of an amount of a change in the lasing wavelength is replaced by control by said temperature control means of the amount of change in the lasing wavelength while retaining the amount of change in the lasing wavelength executed by said current control means.

36. A wavelength-changeable light source comprising:

a semiconductor laser;

current control means for controlling a lasing wavelength of said semiconductor laser by controlling a current supplied to said semiconductor laser; and temperature control means for controlling the lasing wavelength of said semiconductor laser by controlling a temperature of said semiconductor laser, wherein, after the lasing wavelength is changed by said current control means without performing the control by said temperature control means, control by said current control means of an amount of a change in the lasing wavelength is replaced by control by said temperature control means of the amount of change in the lasing wavelength while retaining the amount of change in the lasing wavelength executed by said current control means.

* * * * *

UNITED STATES PATENT AND TRADEMARK OFFICE
CERTIFICATE OF CORRECTION

PATENT NO. : 6,104,516
DATED : August 15, 2000
INVENTOR(S) : Masao Majima

It is certified that error appears in the above-identified patent and that said Letters Patent is hereby corrected as shown below:

Column 2,
Line 22, "can not" should read -- cannot --;
Line 26, "wavelenth -" should read -- wavelength- --;
Line 32, "nanometer" should read -- nanometers --.

Column 3,
Line 15, "wavelenth-" should read -- wavelength- --;
Line 18, "device" should read -- devices --; and
Line 38, "wavelenth-changeable" should read -- wavelength-changeable --.

Column 5,
Line 41, "temperature-towavelength" should read -- temperature-to-wavelength --;
Line 43, "current-towavelength" should read -- current-to-wavelength --.

Claim 7,
Line 36, "loner" should read -- longer --;
Line 40, "lengthes" should read -- length --; and
Line 41, "wavelength" should read -- wavelengths --.

Column 8,
Line 44, "wavelenth-changeable" should read -- wavelength-changeable --.

Column 10,
Line 64, "wavelenth-changeable" should read -- wavelength-changeable --.

UNITED STATES PATENT AND TRADEMARK OFFICE
CERTIFICATE OF CORRECTION

PATENT NO. : 6,104,516
DATED : August 15, 2000
INVENTOR(S) : Masao Majima

It is certified that error appears in the above-identified patent and that said Letters Patent is hereby corrected as shown below:

Column 11,
Line 26, "transmitters 651" should read -- transmitter 651 --.

Signed and Sealed this

Thirteenth Day of November, 2001

Attest:

*Attesting Officer*

NICHOLAS P. GODICI
*Acting Director of the United States Patent and Trademark Office*